United States Patent

Reich et al.

[11] Patent Number: 6,146,165
[45] Date of Patent: Nov. 14, 2000

[54] MECHANISM FOR EJECTING A PLUG-IN MODULE INTRODUCED INTO A SLOT-LIKE OPENING IN A HOUSING

[75] Inventors: Henning Reich, Stadtbergen, Germany; Silvio Dello Buono, Cesinali, Italy

[73] Assignee: Siemens Aktiengesellschaft, Munich, Germany

[21] Appl. No.: 09/424,594
[22] PCT Filed: May 4, 1998
[86] PCT No.: PCT/DE98/01222
    § 371 Date: Nov. 24, 1999
    § 102(e) Date: Nov. 24, 1999
[87] PCT Pub. No.: WO98/54795
    PCT Pub. Date: Dec. 3, 1998

[30] Foreign Application Priority Data

May 27, 1997 [DE] Germany .............................. 197 22 126

[51] Int. Cl.⁷ ................................................. H01R 13/62
[52] U.S. Cl. .......................................................... 439/159
[58] Field of Search ..................................... 439/159, 160, 439/152, 153; 361/754, 798; 360/99.06

[56] References Cited

U.S. PATENT DOCUMENTS

| 5,179,505 | 1/1993 | Matsuo . | |
| 5,179,871 | 1/1993 | Orimoto et al. . | |
| 5,304,070 | 4/1994 | Bertho et al. | 439/157 |
| 5,368,493 | 11/1994 | O'Brien et al. . | |
| 5,374,198 | 12/1994 | Nagata . | |
| 5,384,686 | 1/1995 | Mesfin et al. . | |
| 5,684,655 | 11/1997 | Fujimura . | |
| 5,846,096 | 12/1998 | Ishida | 439/159 |

FOREIGN PATENT DOCUMENTS

| 0 385 750 | 9/1990 | European Pat. Off. . |
| 0 607 848 | 7/1994 | European Pat. Off. . |
| WO 97/10691 | 3/1997 | WIPO . |

Primary Examiner—Neil Abrams
Assistant Examiner—Hae Moon Hyeon
Attorney, Agent, or Firm—Hill & Simpson

[57] ABSTRACT

The eject mechanism is composed of a two-arm lever actuatable with a ram, so that an actuation of the ram acting on the first lever arm creates a release of the plug in contact and an eject motion of the plug in assembly with the assistance of the second lever spatially allocated to the plug-side end of the plug in assembly. In order to achieve different transmission ratios, the first lever arm and the end of the ram facing toward it are fashioned and spatially allocated to one another so that the ram applies to a long lever arm in a first lever phase and applies to a short lever arm in a second lever phase.

7 Claims, 1 Drawing Sheet

MECHANISM FOR EJECTING A PLUG-IN MODULE INTRODUCED INTO A SLOT-LIKE OPENING IN A HOUSING

BACKGROUND OF THE INVENTION

The invention is directed to an eject mechanism having a lever arm mounted on a fulcrum and actuated by a push rod or ram to remove a plug-in assembly from a slot-like opening in a housing to the features A structure wherein individual components can be connected via externally accessible installation locations and plug in contacts provided thereat is prevailing to an every-increasing extent in electronic devices, particularly in the field of computer technology. The installation and removal should thereby be possible in a simple way and optimally without a tool. Whereas the insertion can still be implemented in a relatively simple way, the removal often presents problems because the inserted components are either entirely immerse into the housing or at most slightly project therefrom, so that they cannot be pulled out manually or are very difficult to pull out manually. For this reason, an eject mechanism is provided in a plurality of devices, particularly in portable computers such as notebooks or the like, and the removal of a plug in assembly is capable of being facilitated with the assistance of mechanism by actuating a press button. Examples of this include PCMCIA installation locations in Notebooks, CD-ROM, floppy disk drives, hard disks or the like. The following boundary conditions should thereby be adhered to in principle:

- the pushbutton for the eject mechanism should, on the one hand, not project far from the housing in order to avoid a disturbing entanglement and potential breaking of the pushbutton. On the other hand, the pushbutton should not enter very deeply into the housing for reasons of ergonomy and what is usually very little available space.
- The plug in assembly should come out of the device as far as possible with the assistance of the eject mechanism, so that it can be easily removed by the user.
- For ergonomic reasons, the pressing power on the press button should be as low as possible.
- The outlay for the eject mechanism should be slight.

The aforementioned conditions are partly not met at all and partly only inadequately met given currently known eject mechanisms. The reason for this is that only simple lever arms and, thus, fixed translation relationships are employed for the mechanism, this resulting therein that either the press buttons are difficult to actuate or that the assemblies are not ejected far enough or that the press button projects correspondingly far from the housing due to the longer working stroke that has been selected.

SUMMARY OF THE INVENTION

The present invention is therefore based on the object of improving an eject mechanism, which has a lever arm mounted on a fulcrum and actuated by rod, and which enables both a simple as well as ergonomically advantageous use for the users.

This object is inventively achieved by the lever arm being mounted to have a first portion and a second portion, and a push rod or ram engaging the first portion at an end thereof during an initial or first lever phase and the push rod or ram has a transverse portion for engaging the first portion at a point inward of the end during a second lever phase to shorten the effective length of the first portion to change the lever ratio between the first and second portions to change the rate of ejection of the plug-in assembly. Advantageous developments of the invention are recited in subclaims.

An exemplary embodiment of the invention is explained in greater detail below with reference to an exemplary embodiment.

DESCRIPTION OF THE PREFERRED EMBODIMENT

Figure 1:
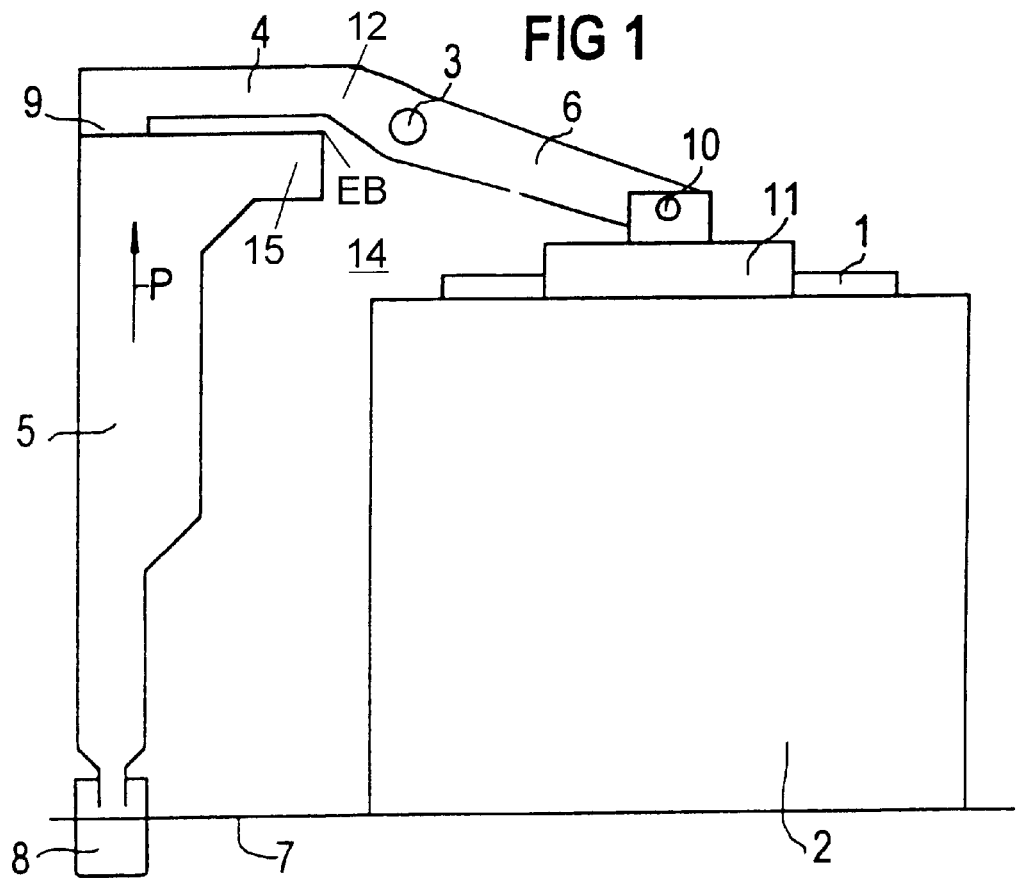
FIG. 1 shows the eject mechanism of the invention in quiescent position.

FIG. 1 shows the principle of an eject mechanism for a plug in assembly 2, for example hard disk, floppy disk, CD-ROM drives of PC plug in cards, insertable from the outside into a slot-like depression of a housing and connectable to a multiple plug 1. The eject mechanism is composed of a two-arm lever pivotably seated around a rotational axis or fulcrum 3, the first lever arm or first portion 4 thereof being allocated to a ram push rod 5 and the second lever arm or second portion 6 thereof of approximately the same length being allocated to the plug in assembly 2. A pushbutton 8 projecting slightly from the housing wall 7 serves for actuation of the ram 5. At the opposite end of the ram 5, i.e. at the end facing toward the first lever arm 4, the ram 5 comprises a transverse component 15 that extends from the free lever end up into the proximity of the rotational axis 3 of the lever. Over and above this, the contacting region between lever arm 4 and ram 5 provided at the free end of the first lever arm 4 is shaped with a nose-like projection 9 at the end of the lever arm 4 and/or at the ram 5 so that, in the quiescent position of the lever, a distance between first lever arm 4 and ram 5 approximately corresponding to the dimensions of the nose-like projection 9 derives in the region of the rotational axis 3. A die pusher element or pluger 11 attached via a revolute joint or pivotable connection 10 is provided at the free end of the second lever arm 6. The pusher element 11 forms the actual eject element and is supported at the back edge of the plug in assembly 2, proceeding parallel to the multiple plug 1.

Figure 2:
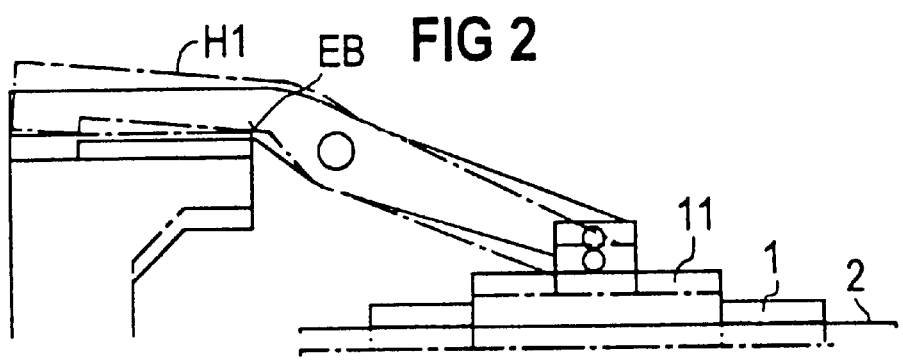
FIG. 2 shows the arrangement according to FIG. 1 in a first working step.
Figure 3:
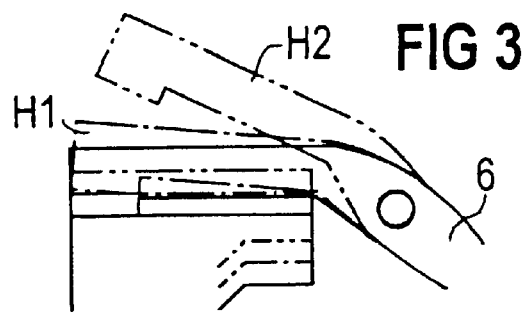
FIG. 3 shows the arrangement according to FIG. 1 in a second working step.

The eject mechanism shown and described in detail on the basis of FIG. 1 is now explained in greater detail below with the assistance of the working steps shown in FIGS. 2 and 3. By pressing the pushbutton 8, the ram is moved in arrow direction P, whereby the ram 5 transmits the pressure in the region of the nose-like projection 9 provided at the free end of the first lever arm 4 to the lever. Due to the relatively slight lever translation, slight pressure on the pushbutton 8 already suffices in order to overcome the high plugging forces of the multiple plug 1 and to detach the assembly 2 from the multiple plug 1. In the first lever phase H1 (see the dot-dash lever position shown in FIG. 2), only a relatively slight lever movement occurs, namely to such an extent that the ram 5 presses against the first lever arm 4 with its end region EB of its transverse component 15 extending up into the proximity of the rotational lever axis 3, upon formation of a correspondingly shorter lever arm.

Given continued pressing of the pushbutton 8 or, respectively, of the ram 5, what is achieved with the change in the transmission ratio that is thus produced is that a comparatively long stroke on the part of the second lever arm 6 occurs in the second lever phase H2 (see, in particular, FIG. 3) given a slight stroke on the part of the first lever arm 4, the result thereof being that the plug in assembly 2 can ultimately be ejected very far.

For space reasons, it can be expedient when the lever comprises a crimp bend or offset 12 in the near region of the rotational lever axis 3, and the first lever arm 4 together with ram 5 and pushbutton 8 are arranged at the one side and the second lever arm 6 is arranged at the other side of a carrier 14 board that also accepts the plug in assembly 2 at this side.

We claim:

1. An ejection mechanism for ejecting a plug-in assembly which is insertable into slot-like opening of a housing, said mechanism having a lever arm actuatable by a ram, said lever arm being mounted at a pivot axis to have a first lever arm portion and a second lever arm portion with the ram contacting the first lever arm portion as the end of the second lever arm portion engages the plug-in assembly to eject it from said opening, the improvement comprising the ram facing toward the first lever arm portion having a transverse component extending from the free end of the ram up to approximately the pivot point of the lever arm so that the ram is applied to the end of the first lever arm portion during a first lever action and is applied to a shorter portion of the lever arm during a second lever phase to change the lever ratio for the two lever arm portions.

2. An ejection mechanism according to claim 1, wherein one of the ends of the first lever arm and the ram has a nose-like projection for forming contact between the first lever arm portion and the ram during the first lever phase.

3. An ejection mechanism according to claim 2, wherein the lever has a bend in the region of the lever axis so that the first lever arm portion including the ram is arranged at one side of the bend and the second lever arm portion is arranged at the other side of the bend with a carrier board which also accepts the plug-in assembly.

4. An ejection mechanism according to claim 3, wherein the second lever arm portion has a free end connected by a pivotable connection to a pusher element engaging the plug-in assembly.

5. An ejection mechanism according to claim 1, wherein the second lever arm portion has a free end connected by a pivotable connection to a pusher element engaging the plug-in assembly.

6. An ejection mechanism according to claim 1, wherein the lever arm has an offset in the region of the lever axis so that the first lever arm portion including the ram is arranged on one side of the offset and the second lever arm portion is arranged on another side of the offset with a carrier board that also accepts the plug-in assembly at that side.

7. An ejection mechanism according to claim 6, wherein the second lever arm has a free end connected by a pivotable connection to a plunger engage able with the plug-in assembly.

\* \* \* \* \*